US012806838B2

(12) United States Patent
Zoellner et al.

(10) Patent No.: US 12,806,838 B2
(45) Date of Patent: Nov. 24, 2026

(54) METHOD AND SYSTEM FOR IMPROVING AN INJECTION MOLDING PROCESS

(71) Applicant: Covestro Intellectual Property GmbH & Co. KG, Leverkusen (DE)

(72) Inventors: Olaf Zoellner, Leverkusen (DE); Sebastian Zoppe, Cologne (DE); Christoph Bontenackels, Cologne (DE); Sairam Potaraju, Leverkusen (DE)

(73) Assignee: Covestro Deutschland AG, Leverkusen (DE)

( * ) Notice: Subject to any disclaimer, the term of this patent is extended or adjusted under 35 U.S.C. 154(b) by 1224 days.

(21) Appl. No.: 17/642,738

(22) PCT Filed: Nov. 18, 2020

(86) PCT No.: PCT/EP2020/082569
§ 371 (c)(1),
(2) Date: Mar. 14, 2022

(87) PCT Pub. No.: WO2021/099407
PCT Pub. Date: May 27, 2021

(65) Prior Publication Data

US 2022/0324150 A1 Oct. 13, 2022

(30) Foreign Application Priority Data

Nov. 20, 2019 (EP) .................................... 19210296

(51) Int. Cl.

| | |
|---|---|
| ***B29C 45/76*** | (2006.01) |
| ***B29K 75/00*** | (2006.01) |
| ***G05B 13/04*** | (2006.01) |
| ***G06F 30/20*** | (2020.01) |

(52) U.S. Cl.
CPC ........ *B29C 45/766* (2013.01); *B29C 45/7693* (2013.01); *G05B 13/04* (2013.01);
(Continued)

(58) Field of Classification Search
CPC .............. B29C 45/766; B29C 45/7693; B29C 2945/76939; B29C 2945/76973;
(Continued)

(56) References Cited

U.S. PATENT DOCUMENTS 2,877,501 A * 3/1959 Bradt ...................... B29C 70/14 264/261
5,204,055 A * 4/1993 Sachs ..................... B33Y 40/00 264/432
(Continued)

FOREIGN PATENT DOCUMENTS

DE 4025221 A1 * 2/1992 .......... B29C 45/766
EP 3511783 A1 7/2019

OTHER PUBLICATIONS

Villarreal-Marroquín, María G., Po-Hsu Chen, Rachmat Mulyana, Thomas J. Santner, Angela M. Dean, and José M. Castro. "Multiobjective optimization of injection molding using a calibrated predictor based on physical and simulated data." Polymer Engineering & Science 57, No. 3 (2017): 248-257. (Year: 2016).*
(Continued)

*Primary Examiner* — Rehana Perveen
*Assistant Examiner* — Angel Calle
(74) *Attorney, Agent, or Firm* — The Webb Law Firm

(57) ABSTRACT

The invention relates to a method for improving an injection molding process, wherein a product is produced by an injection molding apparatus through an injection molding process from a precursor charge of precursor material based on process settings applied to the injection molding apparatus, wherein the injection molding process comprises
(Continued)

injecting the precursor charge into a mold of the injection molding apparatus, wherein the precursor charge is produced through a precursor production process described by precursor production parameters, wherein the applied process settings are determined prior to the injection molding process by a computer simulation of the injection molding process executed by a computing apparatus, which computer simulation is based on a simulation model, on the precursor production parameters and on given process conditions of the injection molding process, which given process conditions comprise a shape of the mold. The invention also relates to a corresponding system.

19 Claims, 2 Drawing Sheets

(52) U.S. Cl.
CPC ............... *B29C 2945/76939* (2013.01); *B29C 2945/76973* (2013.01); *B29K 2075/00* (2013.01); *G06F 30/20* (2020.01)

(58) Field of Classification Search
CPC .......... B29C 45/26; B29C 2945/76976; B29K 2075/00; B29K 2101/12; G05B 13/04; G06F 30/20
See application file for complete search history.

(56) References Cited

U.S. PATENT DOCUMENTS

| | | | | |
|---|---|---|---|---|
| 5,835,379 | A * | 11/1998 | Nakano | B29C 45/7693 264/328.13 |
| 2012/0203375 | A1* | 8/2012 | Dorin | G06F 30/20 700/200 |
| 2018/0117816 | A1 | 5/2018 | Mensler et al. | |
| 2019/0105826 | A1 | 4/2019 | Gergov et al. | |
| 2020/0307053 | A1* | 10/2020 | Shimada | B29C 45/766 |

OTHER PUBLICATIONS

Dupret, F., A. Couniot, O. Mal, L. Vanderschuren, and O. Verhoyen. “Modelling and simulation of injection molding.” In Rheology Series, vol. 8, pp. 939-1010. Elsevier, 1999. (Year: 1999).*

Shojaei, Akbar, S. Reza Ghaffarian, and S. Mohammad-Hossien Karimian. “Modeling and simulation approaches in the resin transfer molding process: A review.” Polymer Composites 24, No. 4 (2003): 525-544. (Year: 2003).*

Lee, L. J. “Polyurethane reaction injection molding: process, materials, and properties.” Rubber chemistry and Technology 53, No. 3 (1980): 542-599. (Year: 1980).*

Abdussamea Moammer, NPL, “Investigation towards the impact of conformal cooling on the performance of injection moulds for the packaging industry”, Published: Dec. 2007 (Year: 2007).*

International Search Report for International Patent Application No. PCT/EP2020/082569, mailed Feb. 4, 2021.

Written Opinion for International Patent Application No. PCT/EP2020/082569, mailed Feb. 4, 2021.

* cited by examiner

1- PRODUCT
2- INJECTION MOLDING APPARATUS
3- PRECURSOR CHARGE
4- MOLD
5- PROCESS SETTINGS
6- COMPUTING APPARATUS
7- SIMULATION MODEL
8- PROCESS CONDITIONS
9- SENSOR INSTRUMENT
10- PRODUCT TARGET SPECIFICATIONS
11- PRODUCT DATA
12- PRODUCT MEASUREMENT APPARATUS
13- EXTERNAL DATA
14- EXTERNAL PRODUCT
15- EXTERNAL PRECURSOR CHARGE
16- EXTERNAL PROCESS SETTINGS
17- EXTERNAL INJECTION MOLDING APPARATUS
18- EXTERNAL PROCESS CONDITIONS
19- EXTERNAL PRODUCT DATA
20- EXTERNAL PRODUCT MEASUREMENT APPARATUS
21- PRECURSOR PRODUCTION PARAMETERS
22- PRECURSOR PROCESS VARIABLES
23- PRECURSOR PRODUCTION SETTINGS
24- PRECURSOR PRODUCTION FACILITY
25- STARTING MATERIALS
26- STARTING MATERIALS
27- PECURSOR PRODUCTION MACHINE
28-STARTING MATERIAL PARAMETERS
29- PRECURSOR PRODUCT PARAMETERS
30- PRECURSOR PRODUCTION SETTINGS
31- INJECTION MOLDING FACILITY

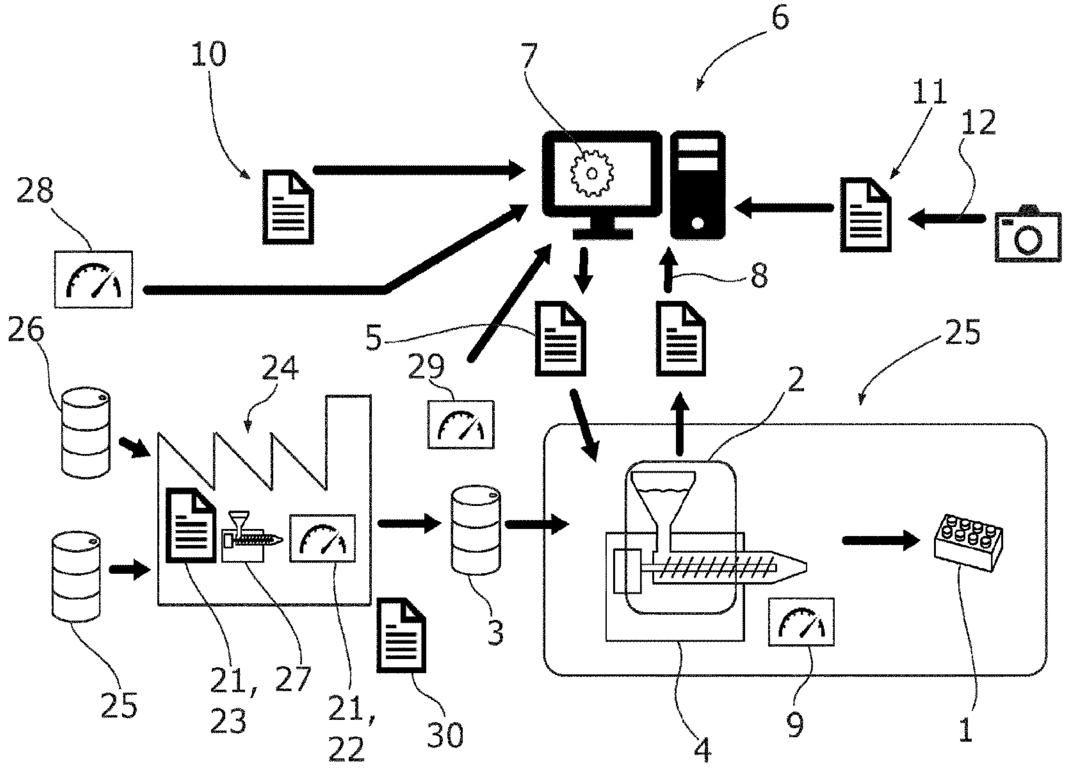

Fig. 1

6- COMPUTING APPARATUS
7- SIMULATION MODEL
13- EXTERNAL DATA
14- EXTERNAL PRODUCT
15- EXTERNAL PRECURSOR CHARGE
16- EXTERNAL PROCESS SETTINGS
17- EXTERNAL INJECTION MOLDING APPARATUS
18- EXTERNAL PROCESS CONDITIONS
19- EXTERNAL PRODUCT DATA
20- EXTERNAL PRODUCT MEASUREMENT APPARATUS

METHOD AND SYSTEM FOR IMPROVING AN INJECTION MOLDING PROCESS

CROSS REFERENCE TO RELATED APPLICATIONS

This application is a U.S. national stage application, filed under 35 U.S.C. § 371, of International Application No. PCT/EP2020/082569, which was filed on Nov. 18, 2020, which claims priority to European Patent Application No. 19210296.0, which was filed on Nov. 20, 2019. The contents of each are hereby incorporated by reference into this specification.

FIELD

The invention is directed at a method for improving an injection molding process and at a system for improving an injection molding process.

BACKGROUND

Production processes and in particular injection molding processes are complex. When a new product is to be produced by means of an injection molding process, a new mold is provided to the injection molding apparatus. In order to achieve a desired high product quality, a number of process settings have to be set correctly. However, because the correct process settings for achieving that desired product quality depend a large number of factors, among them in particular the shape of the mold for the injection molding process and also the quality and parameters of the particular precursor charge used, for a new mold a large number of trial runs of the injection molding process with subsequent analysis of the products have to be conducted before satisfactory process settings can be determined. These extensive trial runs in and of themselves are cost- and time-intensive and therefore undesirable.

In addition, even if satisfactory process settings are finally determined, for the same or a very similar injection molding process to be performed in a different location under somewhat different conditions, again a similarly large number of trial runs will have to be executed again at the different location.

EP 3 511 783 A1 from the prior art discloses a method for improving a chemical production process, wherein a plurality of derivative chemical products are produced through a derivative chemical production process based on at least some derivative process parameters at a respective chemical production facility, which chemical production facilities each comprise a separate respective facility intranet, wherein at least some respective derivative process parameters are measured from the derivative chemical production process by a respective production sensor computer system within each facility intranet, wherein a process model for simulating the derivative chemical production process is recorded in a process model management computer system outside the facility intranets.

The method is characterized in that the process model is transmitted to respective computing modules for performing numerical analysis within each facility intranet from the process model management computer system, that the derivative process parameters at each chemical production facility are provided to the respective computing module and that each computing module determines respective modification data for updating the process model by a numerical analysis based on the derivative process parameters at the respective chemical production facility and the process model.

US 2019/0105826 A1, which is considered the closest prior art, discloses a system which includes a cavity, an injection nozzle configured to inject material into the cavity, and a plurality of sensors at sensor locations. Each of the plurality of sensors is configured to measure parameters at one of the sensor locations. The system lacks a strain gauge. The system further includes a controller configured to control a flow rate of the injection of material into the cavity. The controller is configured to receive the measured parameters and compare the received information to predetermined curves. The controller is configured to control the flow rate when the measured parameters deviate from the predetermined curves.

SUMMARY

Therefore, the object of the invention is to provide a method and a system for improving an injection molding process which reduces the number of trial runs when a new such injection molding process is introduced and which makes it easier to transfer results from trial runs at one place to a similar injection molding process at a different place.

With respect to a method for improving an injection molding process the object of the invention is achieved through a method for improving an injection molding process according to claim 1. With respect to a system for improving an injection molding process the object of the invention is achieved through a system for improving an injection molding process according to claim 14.

The invention is based on the recognition that a computer simulation of the injection molding process, which simulation of the injection molding process in particular takes into account not only the shape of the mold but also production information of the precursor charge, can be used to determine process settings for the injection molding process that are at least closer to those process settings found to result in a product of acceptable quality. In other words, using the computer simulation relying on the shape of the mold and additional production information about the precursor charge may permit to arrive at process settings which right away suffice to achieve the desired product quality. Taking into account production information about the precursor charge makes it possible to control for variations in production-related parameters. Alternatively, even if the process settings arrived at by the computer simulation do not already lead to a product of the desired quality, they will provide a better starting point for trial runs than would have been possible to find without the computer simulation. In this way, the number of trial runs is in any case reduced.

Moreover, such a computer simulation may also be used to arrive at process settings which are not used in order to obtain a product with a desired quality for actual use, but to perform an injection molding process and a subsequent analysis of the product, based on which the simulation model of the computer simulation itself can be improved. In other words, the computer simulation may be used as a tool for the design of experiments (DOE). Such a trial of the injection molding process then does not directly contribute to arriving at process settings for achieving the desired product quality for a specific product, but to make the simulation model more precise. In this way, the number of remaining production trials for all subsequent products making use of the computer simulation is reduced.

The method according to the invention is for improving an injection molding process. In the method according to the invention, a product is produced by an injection molding apparatus through an injection molding process from a precursor charge of precursor material based on process settings applied to the injection molding apparatus, wherein the injection molding process comprises injecting the precursor charge into a mold of the injection molding apparatus. The precursor material may comprise a mixture of any number of different components in various proportions.

Further in the method according to the invention, the precursor charge is produced through a precursor production process described by precursor production parameters. Also in the method according to the invention, the applied process settings are determined prior to the injection molding process by a computer simulation of the injection molding process executed by a computing apparatus, which computer simulation is based on a simulation model, on the precursor production parameters and on given process conditions of the injection molding process, which given process conditions comprise a shape of the mold. In other words, the computer simulation relies on a simulation model, which may be a computer program in its own right or a specific data to be used by a general computational modeling program. The computer simulation relies on that simulation model and, as input, to any number of given process conditions of the injection molding process as well as on any number of the precursor production parameters. These given process conditions may be given in that they are based on actual measurements and thereby reflect preexisting reality. The given process conditions may also relate to any other known or assumed physical facts. They may also be hypothetical boundary conditions just assumed to be preexisting. In any case, the given process conditions comprise the shape of the mold. Thereby, the computer simulation relies on the shape of the mold. The nature of this reliance is in principle arbitrary, as long as the shape of the mold factors into the computer simulation and in particular into the process settings determined by the executed computer simulation. Likewise, the reliance of the computer simulation on any one or more of the precursor production parameters may in principle be arbitrary as long as the one or more precursor production parameters factor into the computer simulation and in particular into the process settings determined by the executed computer simulation.

BRIEF DESCRIPTION OF FIGURES

FIG. 1 a schematic view of an embodiment of the system according to the invention for carrying out the method according to the invention and FIG. 2 an additional aspect for the system of FIG. 1 in relation to the provision of external data.

DETAILED DESCRIPTION

Figure 2:
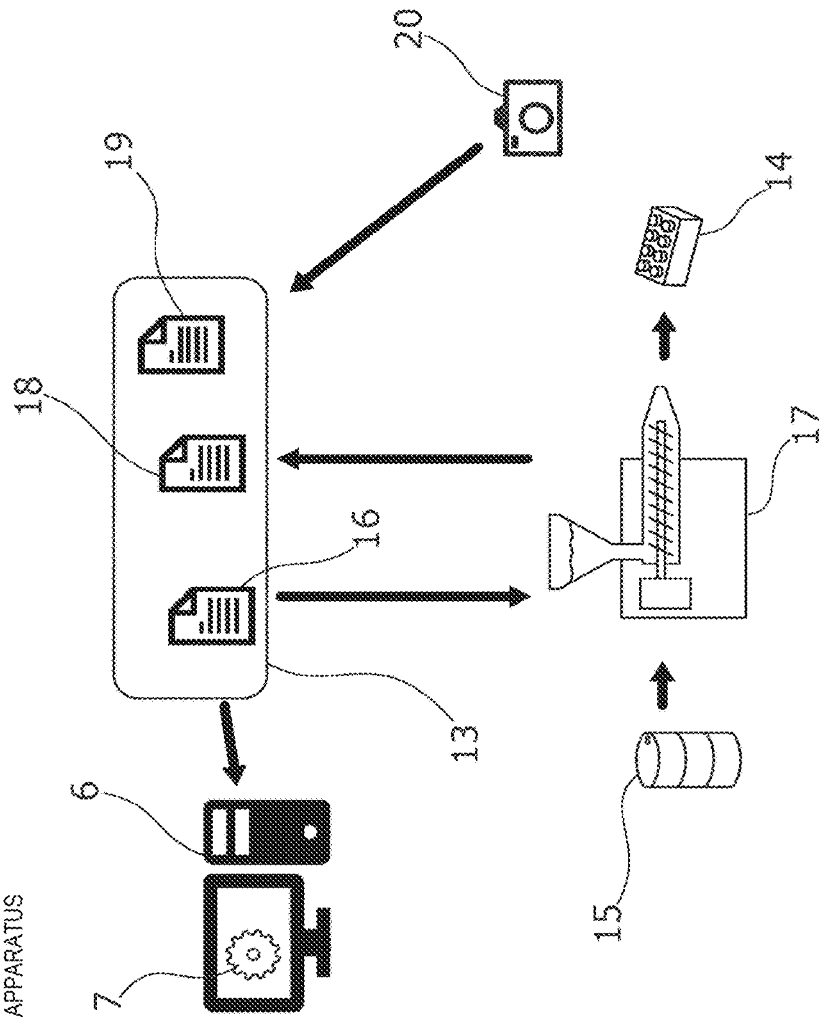

The injection molding process may in principle be any kind of injection molding process. According to a preferred embodiment of the method, the injection molding process comprises a thermoplastic process. Here, the precursor charge may comprise a thermoplastic material, in particular a thermoplastic polymer material. Preferred thermoplastic polymer materials may comprise polycarbonate (PC), polyethylenterephthalate (PET), acrylnitril-butadiene-styrene (ABS), polyamide (PA), polylacetate (PLA), polymethylmethacrylate (PMMA), polyethylene (PE), polypropylene (PP), polystyrene (PS), polyetheretherketone (PEEK) and/or polyvinylchloride (PVC) or mixtures or blends thereof. In particular, in case of a thermoplastic material used in the precursor charge the thermoplastic material may be ready for processing and supplied as bulk material, e.g. in granular form, provided from e.g. a silo in any kind of packaging, e.g. sack, bag etc.

According to a further preferred embodiment of the method, the injection molding process comprises a reactive process. In particular, the reactive process may be a thermoset curing process. Preferably, the product is a polyurethane product and the precursor charge comprises an isocyanate and a polyol for forming the polyurethane product. Thus, the precursor charge may comprise any number of precursor sub-charges. The precursor charge may in this case also comprise any number of further components and ingredients.

In principle, the computer simulation of the injection molding process may simulate that process in an arbitrary way. A preferred embodiment of the method is characterized in that the computer simulation comprises simulating a flow of the injected precursor charge through the mold based on the shape of the mold. In other words, the simulation of the flow is based on the shape of the mold. Thereby, the shape of the mold factors into the computer simulation and the process settings determined by it. In particular, it may be that simulating the flow of the injected precursor charge through the mold takes into account substantially an entire inner surface of the mold. In this way, the most precise and comprehensive simulation of the flow through the mold can be achieved. The flow of the injected precursor charge through the mold is one of the most relevant aspects of the injection modeling process and one in which the shape of the mold plays a critical role.

A further preferred embodiment of the method is characterized in that the precursor charge is produced at a precursor production facility distant from an injection molding facility comprising the injection molding apparatus and that the precursor charge is transported to the injection molding facility. Thus, the injection molding process can be improved based on information which was observed off-site. It may also be that the precursor charge is produced at a plurality of precursor production facilities that are each distant from the injection molding facility.

According to a preferred embodiment of the method, the precursor charge comprises a granular polymer material for injection molding. Preferably, the precursor charge is produced through the precursor production process from a starting material. The precursor charge may also be produced through the precursor production process from a plurality of starting materials. The plurality of starting materials may also comprise at least one additive. The at least one additive may comprise a catalyst, in particular hydrochloric acid, water, a blowing agent and/or a foam stabilizer.

The starting material may in particular be a polymer precursor. It is further preferred that the precursor production process comprises a compounding process for producing the granular polymer charge. In particular, the precursor production process is performed by a heated twin-screw extruder.

According to another preferred embodiment of the method, the precursor charge is a liquid charge for injection molding. The plurality of starting materials may comprise aniline, formaldehyde, phosgene, ethylene oxide and/or propylene oxide.

According to a further preferred embodiment of the method, the precursor production parameters comprise precursor production settings applied to the precursor production process. Such precursor production settings may therefore be set and thus input by users of the precursor production process. In this way, the relevance of the production settings during the production of the precursor charge may be taken into account for the injection molding process.

Alternatively or in addition, the precursor production parameters may comprise precursor process variables measured from the precursor production process. In contrast to the precursor production settings, these precursor process variables are not directly determined by a user of the precursor production process, but instead arise as a result and therefore an output of the precursor production process. In terms of relevance for the injection molding process, the precursor process variables may be equal in importance to the precursor production settings.

A preferred embodiment of the method is characterized in that starting material parameters are measured from the starting material and that the computer simulation is further based on the measured starting material parameters. It may also be that starting material parameters are measured from the plurality of starting materials. Such starting material parameters may relate to any physical data that characterizes a particular batch of a given starting material with a specific material composition from a different batch of the given starting material with the specific material composition. Thus, the starting material parameters serve to distinguish individual batches of starting material. Alternatively or in addition, additive parameters from the at least one additive are measured and the computer simulation is further based on the measured additive parameters. Thereby not only the precursor charge and its properties, but also properties of the precursors to the precursor charge may be taken into account.

A further preferred embodiment of the method is characterized in that starting material history data is determined for the starting material and that the computer simulation is further based on the starting material history data. Such starting material history data may represent past processing data relating to the starting material. This may include a production data and/or a storage duration indication.

According to a further preferred embodiment of the method, precursor product parameters are measured from the precursor charge prior to the injection molding process and the computer simulation is further based on the measured precursor product parameters. Such measurement of precursor product parameters may in principle be any kind of measurement and also any kind of measured property of the precursor charge. This makes it possible to take into account properties which can be determined by a measurement of the precursor charge.

A further preferred embodiment of the method is characterized in that simulating the flow of the injected precursor charge through the mold comprises simulating the fluid dynamics of the flow of the precursor charge. Using fluid dynamics for this simulation ensures a greater degree of accuracy for the simulation. Preferably, simulating the flow of the injected precursor charge through the mold comprises simulating the effect of a surface of the mold on the fluid dynamics of the flow of the precursor charge. The consideration of this effect for the simulation improves the accuracy of the simulation further still.

The given process conditions may comprise in principle arbitrary information or parameters determining or influencing the injection molding process. According to a preferred embodiment of the method, the given process conditions include a material composition of the precursor charge. The material composition of the precursor charge defines the materials and their respective proportions making up the precursor charge. It is further preferred that simulating a flow of the injected precursor charge through the mold is based on the material composition of the precursor charge. In other words, the simulation reflects any effects that the material composition of the precursor charge may have on the flow of the injected precursor charge.

According to a further preferred embodiment of the method, the given process conditions comprise ambient conditions of the injection molding process. Such ambient conditions of the injection molding process may comprise an ambient temperature and/or an ambient humidity of the injection molding apparatus. Preferably, the ambient conditions of the injection molding process are measured by sensor instrument of the injection molding apparatus. In an additional or alternative preferred embodiment of the method, the given process conditions comprise fixed characteristics of the injection molding apparatus. These may be constructive features of the injection molding apparatus which are predefined and not subject to change. Such fixed characteristics may comprise for example, a maximum output power of the injection molding apparatus.

In principle, the basis for the computer simulation may be any measurement or approximation of the injection molding apparatus. A preferred embodiment of the method is characterized in that the computer simulation is based on a data representation for computer aided design describing a geometry of a physical component of the injection molding apparatus, which data representation is comprised by the given process conditions. Such a data representation is particularly suitable for use in a simulation because it avoids measurement or approximation errors. Preferably, that the data representation is configured to enable production of the physical component by a component production apparatus. Further, it may be that the data representation has been used for production of the physical component by the component production apparatus. In this case, the highest conformity of the data representation with the actual physical component of the injection molding apparatus can be guaranteed. In particular, it may be that the physical component is the mold. Since the mold and in particular its geometry is particularly important for determining the flow of the injected precursor charge, a data representation of the mold is particularly helpful for an accurate simulation.

A further preferred embodiment of the method is characterized in that the computer simulation comprises a numerical simulation of the injection molding process. Such a numerical simulation is particularly useful when an analytic approach is not possible or appropriate. However, it may also be that the computer simulation comprises determining an analytic solution for simulating the injection molding process.

The method according to the invention may be used to reduce the number of production trials for the injection molding production of a given product with a desired degree of quality. In a corresponding preferred embodiment of the method, a product target specification is provided to the computing apparatus. Here it is further preferred that the computer simulation is based on applying the product target specification to the simulation model. In particular, it may be that the process settings are determined for having the product conform to the product target specification. In other words, the product target specification is applied to the simulation model to determine the process settings that are suitable for meeting the product target specification according to the simulation model.

In the method according to the invention, the product is measured for determining product data by a product measurement apparatus and a quality metric is applied to the product data to determine a metric result for describing conformity of the product with a product target specification prescribing product properties. In other words, the product data represents properties of the product irrespective of specific targets, such as dimensions, weight, roughness of surface, etc. The metric result, on the other hand, is a quantitative or qualitative representation of how closely the product according to the product data hews to the product target specification. The quality metric defines how the metric result is determined. For example, some properties such as weight may allow for a wide latitude whereas other properties such a length dimension may be very narrowly specified. Likewise, divergence from the product target specification for one property may be weighed differently from the divergence of another property.

The results of this measurement is fed back to the simulation model and used to make the simulation model more precise. In the method according to the invention, the simulation model is updated by the computing apparatus based on the product target specification and the metric result.

The results of this measurement may also be fed back to the precursor production. Accordingly, it is preferred that updated precursor production settings are generated by the computing apparatus based on the product data. Preferably, the updated precursor production settings are generated by the computing apparatus based on the product target specification and the metric result. The updated precursor production settings are in particular configured to be applied to the precursor production process.

The method of the invention may also be used for a design of experiments. Thus, a preferred embodiment of the method is characterized in that the process settings are determined in order to improve an accuracy of the simulation model based on the product target specification and the product data. Such determination of the process settings may in addition or alternatively be based on the metric result. In these cases, the aim of the process settings and of the product produced in accordance with the product settings is not to have a product that meets some specifications, but to have a product the analysis of which may be especially useful for updating the simulation model. For example, it may be determined that the simulation model is not precise enough in modeling a flowing behavior in a certain temperature range. In that case, it may be advantageous to set that temperature in the process settings within that temperature range. Based on the measurement of the product produced with those settings, the simulation model may be updated and thereby improved for that temperature range.

The simulation model may in principle be updated based on any data from injection molding processes. Thus, such data is not restricted to be based on products which were produced according to process settings which were generated by the simulation model. In other words, if a third party product was produced by a different injection molding apparatus, data measured from that product together with data underlying that production process can also be used to update the simulation model. Such data is hereinafter called external data. Accordingly, a further preferred embodiment of the invention is characterized in that the simulation model is updated prior to the computer simulation based on external data of an external injection molding process for an external product from an external precursor charge of external precursor material based on external process settings applied to an external injection molding apparatus provided to the computer system. In each case, the prefix external indicates that the entity question is external to the present injection molding apparatus. It is further preferred that the external data comprises the external process settings and external process conditions of the external injection molding apparatus.

According to a preferred embodiment of the method, the external data comprises external product data, which external product data has been determined by measuring the external product. Preferably, the external data comprises an external product target specification prescribing properties of the external product. It may further be that the external data comprises external metric data describing conformity of the external product with the external product target specification.

The system according to the invention is for improving an injection molding process and comprises an injection molding apparatus for producing a product through an injection molding process from a precursor charge of precursor material based on process settings applied to the injection molding apparatus. In the system according to the invention, the precursor charge has been produced through a precursor production process described by precursor production parameters.

The system according to the invention also comprises a computing apparatus for determining the applied process settings prior to the injection molding process by executing a computer simulation of the injection molding process, which computer simulation is based on a simulation model, on the precursor production parameters and on given process conditions of the injection molding process, which given process condition comprise a shape of the mold.

In the system according to the invention, the computer simulation is also based on the precursor production parameters, the product is measured for determining product data by a product measurement apparatus and a quality metric is applied to the product data to determine a metric result for describing conformity of the product with a product target specification prescribing product properties.

Further in the system according to the invention, the simulation model (7) is updated by the computing apparatus (6) based on the product data (11), the product target specification (10) and the metric result Preferred embodiments, features and advantages of the system according to the invention correspond to those of the method according to the invention and vice versa.

Further advantageous and preferred features are discussed in the following description with respect to the Figures.

The system according to an embodiment of the invention shown in FIG. 1 concerns an injection molding process for producing a product 1, which accordingly is an injection molded product and here a polyurethane product. The described system comprises an injection molding apparatus 2 at which the injection molding process is executed to produce the derivative physical product 1. In that injection molding process, a precursor charge 3 of precursor material, which here is a liquid charge and comprises an isocyanate and a polyol, is injected into a mold 4 of the injection molding apparatus 2. In particular, the precursor charge 3 comprises an isocyanate and a polyol as respective sub-charges. The injection molding process is based on and determined by process settings 5 which are applied and therefore input to the injection molding apparatus 2.

The precursor charge 3 in turn is produced at a precursor production facility 24, which is distant and thus separate from an injection molding facility 31 with the injection molding apparatus 2. Therefore, the precursor charge 3 is transported to the injection molding facility 31 prior to the injection molding process. At the precursor production facility 24, the precursor charge 3 is produced from a plurality of starting materials 25, 26 using a precursor production machine 27 of the precursor production facility 24. Of these starting materials 25, 26, only a first starting material 25 being aniline and a second starting material 26 being formaldehyde are shown. Specifically, these are starting materials 25, 26 for the production of the isocyanate of the precursor charge 3.

The production of the precursor charge 3 at the precursor production facility 24 is described by precursor production parameters 21. These precursor production parameters 21 comprise on the one hand precursor production settings 23, which are set and applied to the precursor production process. Thus, the precursor production settings 23 are user-set or at least user-settable. The precursor production parameters 21 comprise on the other hand precursor process variables 22 measured from the precursor production process. Unlike the precursor production settings 23, the precursor process variables 22 present an output of the precursor production process rather than an input.

In addition starting material parameters 28 are measured from the starting materials 25, 26. Moreover precursor product parameters 29 are measured from the precursor charge 3. In this way, prior to the injection molding process, comprehensive information on the precursor charge 3, the starting materials 25, 26 it is based on and its production process is available.

Those process settings 5 were previously determined by a computer simulation of the injection molding process. That computer simulation was executed on a computing apparatus 6 of the system, which computing apparatus 6 in the present case is a desktop computer but could also be a cloud computing system. The computer simulation relies on a simulation model 7 stored in the computing apparatus 6. The simulation model is a software module replicating the physical processes of the injection molding process. The computer simulation relies on given process conditions 8 of the injection molding process, which are input to the computing apparatus 8.

These given process conditions 8 comprise basic technical information about the injection molding apparatus 2. They also comprise ambient conditions of the injection molding process measured by a sensor instrument 9 of the injection molding apparatus, which is here a thermometer. To provide information about the geometry of the mold 4, which in the present example is a new mold 4 which has not been used for an injection molding process before, the given process conditions 8 comprise a data representation derived from computer aided design for the mold 4. It is the data representation that was used for production of the mold 4, thereby ensuring accuracy with the actual mold 4 of the injection molding apparatus 2.

The computer simulation also relies on the precursor production parameters 21 described above, the starting material parameters 28 and the precursor product parameters 29. In this way, the computer simulation can also take into account comprehensive information about the particular precursor charge 3 to be used for the injection molding process in simulating that injection molding process.

In the computer simulation a flow of the injected precursor charge 3 through the mold 4 is numerically simulated, for example by the finite element method. The fluid dynamics of this process are simulated comprehensively, taking into account the geometry of the mold 4 including the effect of the inner surface of the mold 4. The computer simulation 4 also accounts for temperature, pressure and other factors affecting e.g. the viscosity and other physical properties of the injected precursor charge during injection molding. The other given process conditions are equally considered in the computer simulation. The process of the computer simulation comprises several individual simulation runs, with each simulation having different underlying simulation parameters. In the present case, a product target specification 10 is also provided to the computing apparatus 6. The product target specification 10 prescribes certain values for some physical properties of the product 1 that are to be met. This product target specification 10 is used in the computer simulation. In particular, the computer simulation executes several simulation runs in order to arrive at process settings 5 which are assumed to result in a product 1 that meets the product target specification 10 in light of the given process conditions 8, in particular the shape of the mold 4 as defined by the data representation.

After the product 1 has been produced in accordance with the process settings 5 from the computer simulation, the product 1 is measured by a product measurement apparatus 12, which in the present case is a high resolution camera and analysis device. The product measurement apparatus 12 generated product data 11 from this measurement, which is provided to the computing apparatus 6.

In the computing apparatus, firstly a quality metric relating to the product target specification 10 is applied to the product data 11, which results in a metric result quantifying conformity of the product 1 with the product target specification. Depending in the metric result, the finished product 1 may be deemed satisfactory or not.

Secondly, based on the product data 11, the simulation model 7 may be updated. If the product data 11 substantially corresponds to what was to be expected in accordance with the results of the computer simulation, little or no changes to the simulation model 7 may be appropriate. If, on the other hand, a significant deviation of the product data 11 from the predictions of the computer simulation are observed, more significant changes to the simulation model 7 may be in order. In any case, the updated simulation model 7 may be used for the next determination of the process settings 5.

Further, based on the product data 11, also updated precursor production settings 30 are generated. These updated precursor production settings 30 are to obtain more suitable precursor charges 3 in light of the results measured from the product 1. The updated precursor production settings 30 are provided to the precursor production process for the subsequent production of further precursor charges 3.

The system and method of the invention in FIG. 1 may also be used for a design of experiments. For this purpose, process settings 5 are determined by the computer simulation executed by the computing apparatus 6 and based on the simulation model 7 as well as on the given process conditions 8 such as the shape of the mold 4 not in order to have a product 1 conform to a product target specification 10, but instead in order to improve the simulation model 7. In this case, the process settings 5 are determined such that based on an analysis of the product data 11 of the then produced product 1, the simulation model 7 can be improved in a simulation region in which it is in need of improving.

However, the simulation model 7 may also be improved by external data 13 which is obtained from an injection molding process that did not in any way rely on process settings 5 determined by relying on the simulation model 7. The prefix "external" here is to denote that the entity immediately following is not a feature of the inventive system itself, but rather from a distinct and thereby different system. That different system may be identical or similar in construction and operation to the system according to the invention of FIG. 1.

Because such external data 13 presents validly observed data nonetheless, it too can be used to improve the accuracy of the simulation model 7. Such a situation is explained with reference to FIG. 2, in which for reasons of better clarity only the computing apparatus 6 and the simulation model 7 of the system of FIG. 1 are shown.

As shown in FIG. 2, an external product 14 is produced in an external injection molding process from an external precursor charge 15 by external injection molding apparatus 17 based on external process settings 16 that are applied to the external injection molding apparatus 17.

As shown in FIG. 2, the external data 13 comprises external process settings 16 and external process conditions 18, which two are analogous with respect to the external injection molding apparatus 17 to the process settings 5 and the given process conditions 8, respectively. The external data 13 further comprises external product data 19 determined by a measurement of the external product 14 by an external product measurement apparatus 20.

The invention claimed is:

1. A method for producing a product by an injection molding process, the method comprising:

preparing a precursor charge produced through a precursor production process described by precursor production parameters;

prior to injecting the precursor charge into an injection molding apparatus, determining process settings by executing a computer simulation of the injection molding process by a computing apparatus, the computer simulation based on a simulation model and on given process conditions of the injection molding process, the given process conditions comprising a shape of a mold of the injection molding apparatus, the computer simulation also based on the precursor production parameters, wherein executing the computer simulation comprises simulating a flow of the injected precursor charge through the mold based on the shape of the mold;

injecting the precursor charge into the mold and applying the determined process settings to form the product;

determining product data of the product by a product measurement apparatus;

applying a quality metric to the product data to determine a metric result for describing conformity of the product with a product target specification prescribing product properties; and updating the simulation model by the computing apparatus based on the product data, the product target specification, and the metric result.

2. The method according to claim 1, wherein the injection molding process comprises a thermoplastic process.

3. The method according to claim 1, wherein the injection molding process comprises a reactive process.

4. The method according to claim 1, wherein simulating the flow of the injected precursor charge through the mold comprises simulating the fluid dynamics of the flow of the precursor charge.

5. The method according to claim 1, wherein the given process conditions comprise a material composition of the precursor charge.

6. The method according to claim 1, wherein the given process conditions comprise ambient conditions of the injection molding process.

7. The method according to claim 1, wherein the computer simulation is based on a data representation for computer aided design describing a geometry of a physical component of the injection molding apparatus, wherein the data representation is comprised by the given process conditions.

8. The method according to claim 1, wherein the computer simulation comprises a numerical simulation of the injection molding process.

9. The method according to claim 1, wherein a product target specification is provided to the computing apparatus.

10. The method according to claim 1, wherein the process settings are determined in order to improve an accuracy of the simulation model based on the product target specification and the product data.

11. The method according to claim 1, wherein the simulation model is updated prior to the computer simulation based on external data of an external injection molding process for an external product from an external precursor charge of external precursor material based on external process settings applied to an external injection molding apparatus provided to the computer system.

12. The method according to claim 11, wherein the external data comprises external product data, wherein the external product data has been determined by measuring the external product.

13. The method according to claim 3, wherein the injection molding process comprises a reactive process, wherein the product is a polyurethane product and wherein the precursor charge comprises an isocyanate and a polyol for forming the polyurethane product.

14. The method according to claim 4, wherein simulating the flow of the injected precursor charge through the mold comprises simulating the effect of a surface of the mold on the fluid dynamics of the flow of the precursor charge.

15. The method according to claim 5, wherein the computer simulation comprises simulating a flow of the injected precursor charge through the mold based on the material composition of the precursor charge.

16. The method according to claim 6, wherein the ambient conditions of the injection molding process are measured by a sensor instrument of the injection molding apparatus.

17. The method according to claim 7, wherein the data representation is configured to enable production of the mold by a component production apparatus.

18. The method according to claim 9, wherein the process settings are determined for having the product conform to the product target specification.

19. A system for producing a product by an injection molding process, the system comprising:

a mold;

an injector for injecting a precursor charge into the mold, the precursor charge produced through a precursor production process described by precursor production parameters, the precursor charge injected by the injector into the mold according to determined process settings forming the product;

a product measurement device configured to determine product data of the product and apply a quality metric to the product data to determine a metric result for describing conformity of the product with a product target specification prescribing product properties; and a computing system configured to:

prior to the injector injecting the precursor charge into the mold, determine the determined process settings by executing a computer simulation of the injection molding process, the computer simulation based on a simulation model and on given process conditions of the injection molding process, the given process conditions comprising a shape of a mold, the computer simulation also based on the precursor production parameters, wherein executing the computer simulation comprises simulating a flow of the injected precursor charge through the mold based on the shape of the mold; and update the simulation model based on the product data, the product target specification, and the metric result.

* * * * *